(12) United States Patent
Shen et al.

(10) Patent No.: US 6,989,682 B1
(45) Date of Patent: Jan. 24, 2006

(54) TEST KEY ON A WAFER

(75) Inventors: Tsung-Wei Shen, Hsin-Chu (TW); Bo-Shao Soong, Tai-Chung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/907,007

(22) Filed: Mar. 16, 2005

(51) Int. Cl.
G01R 31/28 (2006.01)
G01R 31/02 (2006.01)

(52) U.S. Cl. ............... 324/763; 324/758; 324/765

(58) Field of Classification Search ............ None
See application file for complete search history.

(56) References Cited

U.S. PATENT DOCUMENTS

| | | | | |
|---|---|---|---|---|
| 4,824,254 A | * | 4/1989 | Ohtsuka et al. | 356/401 |
| 4,933,635 A | * | 6/1990 | Deutsch et al. | 324/766 |
| 5,014,003 A | * | 5/1991 | Ishikawa | 324/758 |
| 5,059,899 A | * | 10/1991 | Farnworth et al. | 438/18 |
| 5,065,092 A | * | 11/1991 | Sigler | 324/758 |

* cited by examiner

*Primary Examiner*—Ernest Karlsen
(74) *Attorney, Agent, or Firm*—Winston Hsu

(57) ABSTRACT

A test key formed on a wafer has a plurality contacting pads, a first wire, and a second wire. The contacting pads are separated into a first group and a second group. The first wire surrounds at least one contacting pad of the first group and connects with one the contacting pad of the second group. The second wire connects with one contacting pad of the first group and surrounds at least one contacting pad of the second group.

20 Claims, 2 Drawing Sheets

TEST KEY ON A WAFER

BACKGROUND OF INVENTION

1. Field of the Invention

The present invention relates to a test key formed on a wafer, and more specifically, to a test key for checking the contacting status of a probe card.

2. Description of the Prior Art

In semiconductor fabrication, a semiconductor device or an integrated circuit (IC) is continuously tested in every step so as to maintain device quality. Normally a testing circuit is simultaneously fabricated with an actual device so that the quality of the actual device is judged by the performance of the testing circuit. The quality of the actual device therefore is well controlled.

A typical method to test a wafer is called a wafer acceptance testing (WAT) method, which can measure defects in a wafer. The WAT method includes providing several test keys distributed in a periphery region of a die that is to be tested. The test keys typically are formed on a scribe line between dies, and are electrically coupled to an external terminal through a metal pad. A module of the test keys is selected and each test key off the selected module is respectively used for a test of different property of the wafer, such as threshold voltage ($V_T$) or saturate current ($ID_{SAT}$). A controlled bias is applied to the test keys, and the induced current is read out to detect defects on the wafer.

When using the test keys to measure the defects of the dies, a probe card with a plurality probes is used to contact with the contacting pads of the test keys so as to proceed the measurement. However, if the probes of the probe card do not properly contact with the contacting pads of the test keys when proceeding the measurement, the real characteristics of the test keys can be known according to the result of the measurement, and then the defects of the dies are hard to be detected. Therefore, when a WAT test proceeding, how to make sure that all of the probes of the probe card are properly contacted with the contacting pads of the test keys is an important issue.

SUMMARY OF INVENTION

It is therefore a primary objective of the present invention to provide a test key for checking whether all of the probes of a probe card properly contact with the contacting pads of the test keys.

The test key is formed on a wafer and has a plurality contacting pads, a first wire, and a second wire. The contacting pads are separated into a first group and a second group. The first wire surrounds at least one contacting pad of the first group and connects with one the contacting pad of the second group. The second wire connects with one contacting pad of the first group and surrounds at least one contacting pad of the second group.

When the probes of the probe card contact with the test key, the probe card is capable of checking whether all of the probes of the probe card properly contact with the contacting pads of the test key by measuring the resistance between the probes of the probe card.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
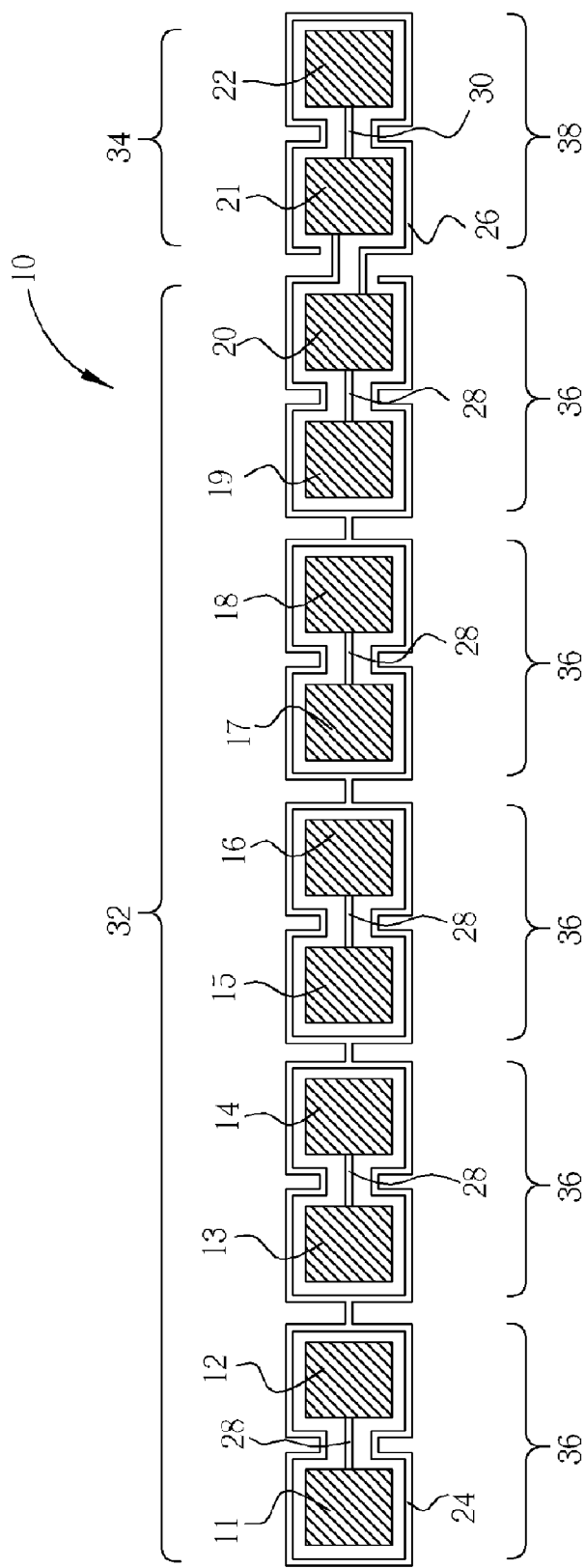
FIG. 1 is a layout diagram of a first embodiment test key according to the present invention.

Please refer to FIG. 1, which is a first embodiment test key 10 according to the present invention. The test key 10 is formed on a wafer and has a plurality of contacting pads 11–22, which are arranged as a straight line. Each of the contacting pads 11–22 is made of electric conductive material and corresponded to a corresponding probe of a probe card. Therefore, the number of the contacting pads 11–22 is not greater than the number of the probes of the probe card. In the embodiment, the contacting pads 11–20 are classified as a first group 32, and the contacting pads 21–22 are classified as a second group 34. The test key 10 further comprises a first wire 24, a second wire 26, a plurality of third wires 28, and a fourth wire 30. The first wire 24 surrounds the ten contacting pads 11–20 of the first group 32 and connects with the contacting pad 21 of the second group 34. The second wire 26 surrounds the two contacting pads 21–22 of the second group 34 and connects with the contacting pad 20 of the first group 32. The ten contacting pads 11–20 of the first group 32 are further separated into five first subgroups 36, and the contacting pads 21–22 are separated into at least a second subgroup 38. Each of the first subgroups 36 and the second subgroup 38 has two of the contacting pads 11–22. The two contacting pads (11 and 12), (13 and 14), (15 and 16), (17 and 18), or (19 and 20) of each the first subgroup 36 are connected to each other via a corresponding one of the third wires 28, and the two contacting pads 21–22 are connected to each other via the fourth wire 30. Moreover, the intervals between the first wire 24 and the contacting pads 11–20 of the first group 32 and the intervals between the second wire 26 and the contacting pads 21–22 of the second group 34 are greater than 0.05 $\mu$M and less than 1 $\mu$M.

As previously mentioned, each of the contacting pads 11–22 corresponds to a probe of the probe card. Normally, each of the contacting pads 11–22 should be contacted by its corresponding probe while proceeding the measurement. When the probe card contacts with the test key 10, in order to check whether all of the probes of the probe card properly contact with the contacting pads 11–22 or not, the probe card detects the resistance between the probes. If the detected resistance is abnormal, it means that not all of the probes contact the contacting pads 11–22 properly. For example, to check the two probes corresponded to the two contacting pads 11–12 whether contact with the contacting pads 11–12 properly, the probe card detects the resistance between the two probes corresponded to the two contacting pads 11–12. If the detected resistance between the two probes is less than a predetermined value, it means that a circuit loop is formed by the two contacting pads 11–12 and the probe card and that the corresponding probes properly contact with the contacting pads 11–12. Otherwise, if the detected resistance is greater than the predetermined value, it means that the two contacting pads 11–12 and the probe card are on an open circuit status and that at least one of the two contacting pads 11–12 is not properly contacted by its corresponding probe. By the same way, the probe card is capable of detecting whether the two contacting pads of each subgroup 36, 38 are properly contacted by their corresponding probes.

In addition, the probe card is capable of detecting whether the probes contact with the test key 10 but without contacting with corresponding contacting pads 11–22. For example, the probe card can detect the resistance between the two contacting pads 11 and 21 to determine whether the probe corresponded to the contacting pad 11 properly contact with the contacting pad 11. If the resistance detected by the probe card is less than another predetermined value, it means that a circuit loop is formed by the two contacting pads 11, 21 and the probe card and that the probe corresponded to the contacting pad 11 properly contacts with the first wire 24. In this case, the probe corresponded to the contacting pad 11 should be adjusted. By the way, the probe card is capable of determining whether the probes corresponded to the contacting pads 11–20 of the first group 32 properly contact with their corresponding contacting pads 11–20 by detecting the resistance between the probe corresponded to the contacting pad 21 and the probe corresponded to the target contacting pad of the first group 32. Oppositely, the probe card is capable of determining whether the probes corresponded to the contacting pads 21–22 of the second group 34 properly contact with their corresponding contacting pads 21–22 by detecting the resistance between the probe corresponded to the contacting pad 20 and the probe corresponded to the target contacting pad 21 or 22 of the second group 34.

In this embodiment, the second group 34 comprises one second subgroup 38. However, it should be noted that the present invention is not limited by this. The number of the second subgroup 38 of the second group 34 can be larger than 1, and the number of the first subgroups 36 of the first group 32 can less or greater than 5.

Figure 2:
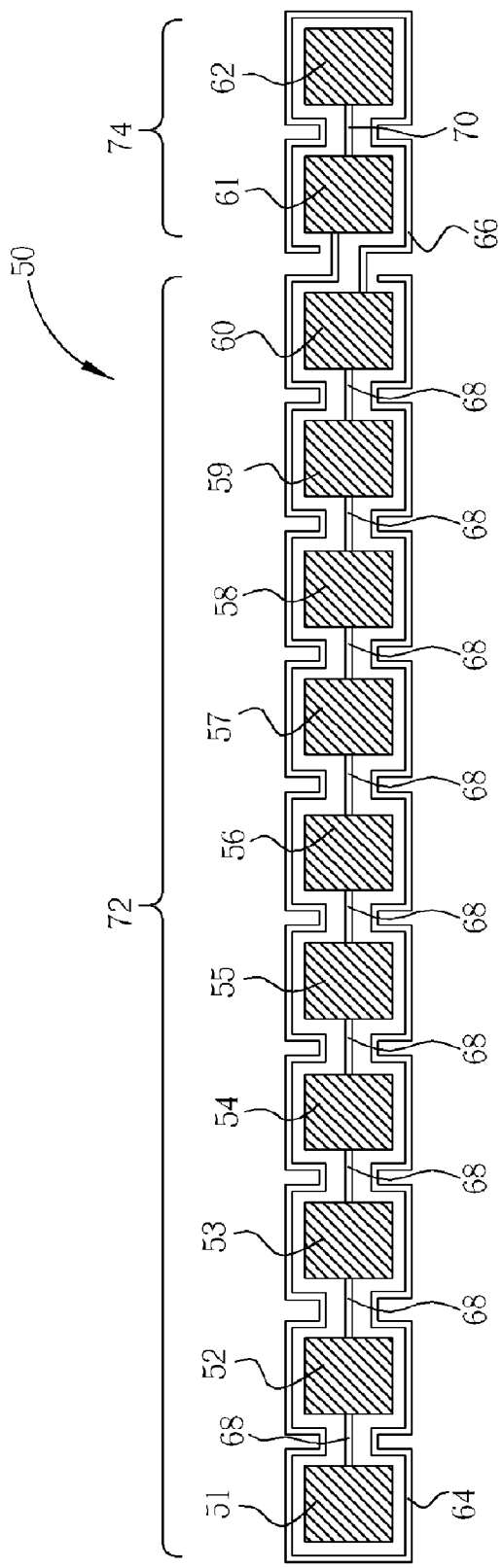
FIG. 2 is a layout diagram of a second embodiment test key according to the present invention.

Please refer to FIG. 2, which is a layout diagram of a second embodiment test key 50 according to the present invention. Similarly, the test key 50 is also formed on a wafer and has a plurality of contacting pads 51–62, which are arranged as a straight line. Each of the contacting pads 51–62 is made of electric conductive material and corresponded to a corresponding probe of the probe card. In the embodiment, the contacting pads 51–60 are classified as a first group 72, and the contacting pads 61–62 are classified as a second group 74. The test key 50 further comprises a first wire 64, a second wire 66, a plurality of third wires 68, and a fourth wire 70. The first wire 64 surrounds the ten contacting pads 51–60 of the first group 72 and connects with the contacting pad 61 of the second group 74. The second wire 66 surrounds the two contacting pads 61–62 of the second group 74 and connects with the contacting pad 60 of the first group 72. All of the contacting pads 51–60 are connected together via the third wires 68, and all of the contacting pads 61–62 are connected together via the fourth wire 70. Moreover, the intervals between the first wire 24 and the contacting pads 11–20 of the first group 32 and the intervals between the second wire 26 and the contacting pads 21–22 of the second group 34 are greater than 0.05 $\mu$M and less than 1 $\mu$M.

The probe card is capable of detecting whether its probes properly contact with the contacting pads 51–62 by measuring the resistance between its probes. For example, the probe card determines whether the probes corresponded to the contacting pads 51–60 of the first group 72 properly contact with contacting pads 51–60 by measuring the resistance between the probe corresponded to the contacting pad 61 of the second group 74 and the probes corresponded to the contacting pads 51–60 of the first group 72. Moreover, the probe card is capable of selecting two contacting pads from the contacting pads 51–60 of the first group 72 and determining whether the two corresponding probes properly contact with the selected contacting pads by measuring the resistance between the two corresponding probes. For example, to check the two probes corresponded to the two contacting pads 53, 58 whether contact with the contacting pads 53 and 58 properly, the probe card detects the resistance between the two probes corresponded to the two contacting pads 53, 58. If the detected resistance between the two probes is less than the predetermined value, it means that a circuit loop is formed by the two contacting pads 53, 58 and the probe card and that the corresponding probes properly contact with the contacting pads 53 and 58. Otherwise, if the detected resistance is greater than the predetermined value, it means that the two contacting pads 53, 58 and the probe card are on an open circuit status and that at least one of the two contacting pads 53 or 58 is not properly contacted by its corresponding probe.

It is noted that the present invention is not limit by the above two embodiments. Various embodiments of the present invention can be deduced from the two previously mentioned embodiments. For example, the two contacting pads 12 and 13 shown in FIG. 1 can be connected together via another third wire 68 just like the connected contacting pads 52 and 53 shown in FIG. 2. Naturally, in this case, the first wire 24 cannot contact with the added third wire 68, and the layout of the test key 10 in other place except the part between the two contacting pads 52, 53 is not changed. In another instance, the third wires 68 connected with the contacting pads 52–59 of the first group 72 can be omitted in a condition that each of the contacting pads 51–60 of the first group 72 have to connect with at least one adjacent contacting pad via one of the third wires 68.

In comparison with the prior art, the test key according to the present invention has a plurality of contacting pads, which are separated into a first group and a second group. The contacting pads of the first group are surrounded by a first wire, which connects to one of the contacting pads of the second group. The contacting pads of the second group are surrounded by a second wire, which connects to one of the contacting pads of the first group. Therefore, a probe card is capable of detecting whether its probes properly contact with the contacting pads of the test key according to the measured resistance between the probes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key formed on a wafer comprising:
    a plurality of contacting pads separated into a first group and a second group;
    a first wire for surrounding at least one contacting pad of the first group and connecting to one contacting pad of the second group; and
    a second wire for surrounding at least one contacting pad of the second group and connecting to one contacting pad of the first group.

2. The test key of claim 1 wherein the contacting pads are arranged as a straight line.

3. The test key of claim 1 wherein all the contacting pads of the first group are surrounded by the first wire.

4. The test key of claim 1 wherein all the contacting pads of the second group are surrounded by the second wire.

5. The test key of claim 1 further comprising:
a plurality of third wires, each of the third wires is connected to two corresponding contacting pads of the first group; and
at least a fourth wire, the fourth wire is connected to two corresponding contacting pads of the second group.

6. The test key of claim 5 wherein each of the contacting pads of the first group is connected to at least an adjacent contacting pad via one of the third wires.

7. The test key of claim 5 wherein there is at least one contacting pad of the first group is connected to two adjacent contacting pads via two of the third wires.

8. The test key of claim 5 wherein all of the contacting pads of the first group are connected together via the third wires.

9. The test key of claim 1 wherein intervals between the first wire and the contacting pads of the first group and intervals between the second wire and the contacting pads of the second group are greater than 0.05 $\mu M$ and less than 1 $\mu M$.

10. A test key formed on a wafer comprising:
a plurality of contacting pads separated into a first group and a second group, the contacting pads of the first group are separated into a plurality of first subgroups, and the contacting pads of the second group are separated into at least a second subgroup;
a first wire for surrounding at least one first subgroup and connecting to one contacting pad of the second group; and
a second wire for surrounding at least one contacting pad of the second group and connecting to one contacting pad of the first group;
a plurality of third wires, each of the third wires is connected to two contacting pads of a corresponding first subgroup; and
at least a fourth wire, the fourth wire is connected to two contacting pads of the second subgroup.

11. The test key of claim 10 wherein the contacting pads are arranged as a straight line.

12. The test key of claim 10 wherein all the contacting pads of the first group are surrounded by the first wire.

13. The test key of claim 10 wherein all the contacting pads of the second group are surrounded by the second wire.

14. The test key of claim 10 wherein intervals between the first wire and the contacting pads of the first group and intervals between the second wire and the contacting pads of the second group are greater than 0.05 $\mu M$ and less than 1 $\mu M$.

15. A test key formed on a wafer comprising:
a plurality of contacting pads arranged as a straight line and separated into a first group and a second group;
a first wire for surrounding at least one contacting pad of the first group and connecting to one contacting pad of the second group; and
a second wire for surrounding at least one contacting pad of the second group and connecting to one contacting pad of the first group;
a plurality of third wires for connecting all of the contacting pads of the first group together; and
at least a fourth wire for connecting two contacting pads of the second group.

16. The test key of claim 15 wherein all of the contacting pads of the second group are connected together via the fourth wires.

17. The test key of claim 15 wherein the contacting pads are arranged as a straight line.

18. The test key of claim 15 wherein all the contacting pads of the first group are surrounded by the first wire.

19. The test key of claim 15 wherein all the contacting pads of the second group are surrounded by the second wire.

20. The test key of claim 15 wherein intervals between the first wire and the contacting pads of the first group and intervals between the second wire and the contacting pads of the second group are greater than 0.05 $\mu M$ and less than 1 $\mu M$.

* * * * *